United States Patent [19]

Visser et al.

[11] 4,272,644

[45] Jun. 9, 1981

[54] ELECTRONIC HYBRID CIRCUIT PACKAGE

[75] Inventors: Ronald C. Visser, Bedford; G. James Estep, Georgetown; Alan S. Esbitt, Lynnfield, all of Mass.

[73] Assignee: Hybrid Systems Corporation, Bedford, Mass.

[21] Appl. No.: 79,581

[22] Filed: Sep. 27, 1979

[51] Int. Cl.³ .............................................. H05K 5/00
[52] U.S. Cl. ................................. 174/52 FP; 357/74
[58] Field of Search ............ 174/52 FP, 52 S, 52 PE; 357/74, 75; 361/380

[56] References Cited

U.S. PATENT DOCUMENTS

| 3,501,582 | 3/1970 | Heidler et al. | 174/52 PE |
| 3,689,684 | 9/1972 | Cox et al. | 174/52 FP X |
| 3,721,747 | 3/1973 | Renskers | 174/52 FP X |
| 3,737,729 | 6/1973 | Carney | 174/52 FP X |

*Primary Examiner*—C. L. Albritton
*Assistant Examiner*—D. A. Tone
*Attorney, Agent, or Firm*—Weingarten, Maxham & Schurgin

[57] ABSTRACT

A hybrid package which includes a plastic shell having an integral interior configuration for support of a ceramic substrate and terminal pins, and an encapsulate for rigid retention of the pins and for sealing of the package.

6 Claims, 6 Drawing Figures

U.S. Patent    Jun. 9, 1981    4,272,644
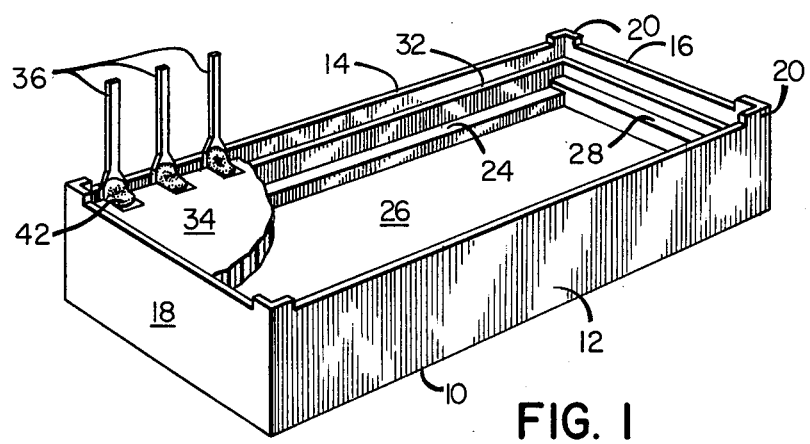
FIG. 1
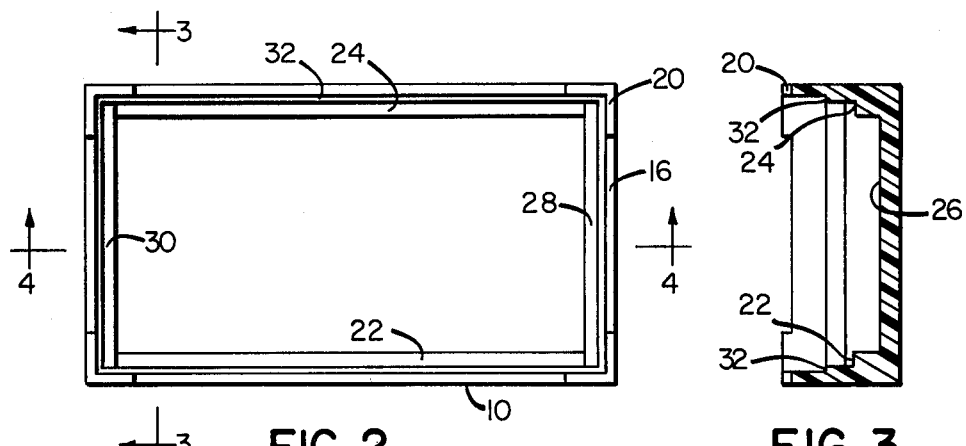
FIG. 2    FIG. 3
FIG. 4
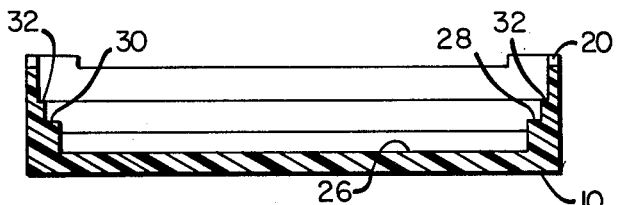
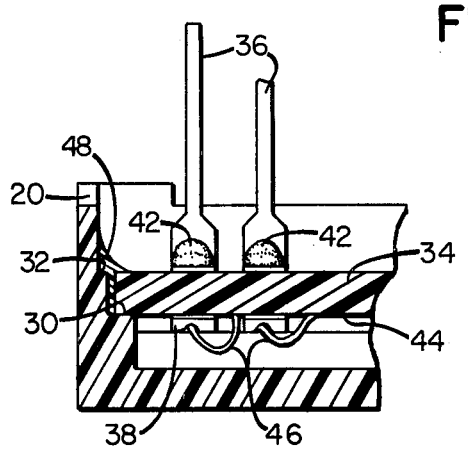
FIG. 5
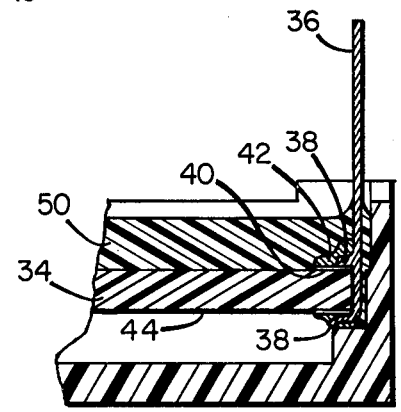
FIG. 6

ELECTRONIC HYBRID CIRCUIT PACKAGE

FIELD OF THE INVENTION

This invention relates to microelectronic circuit packaging and more particularly to a hybrid circuit package.

BACKGROUND OF THE INVENTION

Various packaging techniques are known for microelectronic circuits. In one type of microelectronic circuit, a printed circuit board containing interconnected circuit components which have been inserted and soldered thereon has an array of terminal pins which are attached to the printed circuit board usually along one or more edges thereof. The circuit board is contained within a plastic shell or case, and is supported within the shell on standoffs to retain the board in spaced relation to the inner top surface of the shell to provide clearance space for the components which are mounted on the board. An epoxy or other encapsulate is thereafter provided to fill the shell interior and enclose the circuit board therein. A bottom plate may be included over the encapsulate and through which the terminal pins extend. The resulting package is a small rectangular box with terminal pins outwardly extending from the bottom thereof.

In the type of microelectronic circuit known as a hybrid circuit, a conductive and/or resistive pattern is provided by thick or thin film techniques on one or both surfaces of a ceramic substrate, and monolithic integrated circuit chips and other component chips are affixed to mounting areas on the substrate and interconnected to selected portions of the deposited pattern by wire bonding. For hermetic packaging, the hybrid circuit is usually mounted in a metal housing which is sealed by brazing or welding to provide a moisture and gas tight enclosure.

According to a widely employed hybrid circuit packaging technique, a ceramic substrate containing the hybrid circuit on one surface thereof is mounted within the opposite plain surface on a metal header which has an array of terminal pins affixed thereto usually in two rows along respective opposite sides of the header. The terminal pins extend through the header by means of electrically insulating glass-to-metal seals, and have portions extending outwardly from the surface of the header on which the ceramic substrate is mounted. The hybrid circuit is connected by wire bonding between selected portions of the circuit and corresponding ones of the connection portions of the terminal pins. A lid usually of metal is disposed over the mounted circuit and is brazed or otherwise bonded to the periphery of the header to complete the package.

The hybrid circuit package described above provides suitable hermetic sealing and mechanical protection for the circuit but is of a cost which can be a significant portion of the overall manufacturing cost of the product. To produce a less costly package, hybrid circuits have been fabricated with conformal coatings of encapsulating material; however, such coatings are often not reliable since they are not impervious to moisture leakage which can enter the package and degrade or wholly destroy circuit performance.

SUMMARY OF THE INVENTION

In brief, the present invention provides a hybrid circuit package which is of relatively low cost and having a moisture resistant seal which is wholly sufficient for a wide range of commercial and industrial uses. The hybrid circuit itself can be of well known form comprising a ceramic substrate having a film circuit formed on one or both surfaces of the substrate, and with monolithic chips and components affixed to mounting areas on the substrate and which are wire bonded to selected areas of the film circuit. An array of terminal pins is arranged along one or more edges of the substrate by means of associated pin clips, each pin clip being soldered to a respective mounting pad on the substrate surface. A plastic shell or case is provided having an integral interior configuration for retaining the substrate and pins in positive and precisely determined location. The shell includes, in preferred embodiment, first step portions along one pair of confronting sides for support of confronting edges of the substrate. Second step portions are provided along the other pair of confronting sides for accommodation of the terminal clips and associated pins. A third step portion is provided outward from the first and second step portions and approximately coplanar with the outer surface of the substrate. An encapsulating material is provided around the periphery of the shell including the third step portion and onto the confronting outer surface of the substrate to seal the package and to rigidly retain the terminal pins which extend through the encapsulated area. The encapsulate may enclose the entire substrate surface or only the peripheral portions thereof.

DESCRIPTION OF THE DRAWINGS

The invention will be more fully understood from the following detailed description taken in conjunction with the accompanying drawings in which:

FIG. 1 is a cutaway pictorial view of a hybrid circuit package according to the invention;

FIG. 2 is a plan view of the package shell in accordance with the invention;

FIG. 3 is a sectional side view of the shell of FIG. 2;

FIG. 4 is a sectional front view of the shell of FIG. 2;

FIG. 5 is a cutaway sectional front elevation view of the assembled package with the encapsulate around the periphery thereof; and FIG. 6 is a cutaway sectional side elevation view of the assembled package fully encapsulated.

DETAILED DESCRIPTION OF THE INVENTION

Referring to the drawings there is shown a hybrid circuit package constructed in accordance with the invention and which includes a rectangular shell 10 having a front wall 12, a rear wall 14 and side walls 16 and 18. Corner portions 20 extend beyond the peripheral edge of the shell to serve as standoffs for maintaining spacing between the mounting surface of a circuit board and the confronting surface of the circuit package mounted thereon. First and second step portions 22 and 24 extend along the respective front and rear walls of shell 10 each being of the same height above the inner surface 26 of shell 10. A pair of step portions 28 and 30 extend along respective side walls and are of the same height and which is above the height of step portions 22 and 24 by a predetermined amount. A further step portion 32 extends along all four sides of shell 10 at a predetermined height above the upper surfaces of step portions 28 and 30. The circuit board 34 is disposed within the shell 10 and is supported on the step portions 28 and 30 which extend along the respective side walls of the package. Such support is shown most clearly in FIG. 5.

The circuit board includes an array of terminal pins 36 which are affixed to the edge of the board by means of associated terminal clips 38 which are adapted to engage conductive solder pads 40 provided on confronting portions of the board surfaces. The terminal pins are secured to the circuit board by means of solder joints 42. Typically the terminal pins 36 are arranged along the respective long edges of the circuit board to provide dual-in-line pin configuration of well known type. The circuit board 34 contains on the inner surface 44 thereof, a pattern of conductive and/or resistive elements formed in known manner by thin or thick film techniques, and including integrated circuit chips and other chip components affixed to mounting areas on the board surface. The terminal pins are electrically connected to selected points of the circuit by means of wire bonds 46. The step portions 28 and 30 are at a sufficient distance above the inner surface 26 to provide an interior space within which the hybrid circuit elements and associated wire bonds are disposed.

With the circuit board mounted within the shell, the terminal pins 36 and associated clips 38 are accommodated by the step portions 22 and 24 as best seen in FIG. 6. The terminal pins 36 outwardly extend from the shell and are generally parallel to the adjacent wall of the shell. The outer surface of circuit board 34 is general coplanar with the peripherally extending step 32. An encapsulate 48 is provided around the periphery of the shell and circuit board, the encapsulate extending across step 32 and the confronting surfaces of the circuit board 34 and confronting portions of the inner shell walls, as illustrated in FIG. 5. The encapsulate may also be disposed in the spaces between the edges of the substrate and the inner shell walls. Alternatively, an encapsulating layer 50 can be provided over the entire outer surface of the circuit board 34 and onto steps 32 and the inner walls, as depicted in FIG. 6. This full encapsulation would be employed for a circuit formed on both surfaces of substrate 34, in order to encapsulate the circuit on the outer substrate surface. In either form of encapsulation, the terminal pins 36 are rigidly captured by the surrounding encapsulating material such that the terminal pins cannot be moved with respect to the circuit board with which they are attached. The encapsulated package is capable of meeting the leakage standards for and is wholly satisfactory for many commercial and industrial purposes.

The shell is typically fabricated of a suitable plastic material such as glass-fiber-filled diallyl phthalate. The particular dimensions of the shell are determined in accordance with the dimensions of the hybrid circuit board with which the shell is employed. The encapsulate can be a suitable epoxy or other encapsulating material to provide the intended degree of leakage resistance.

The invention is not to be limited except as indicated in the appended claims.

What is claimed is:

1. A hybrid circuit package comprising a ceramic substrate, a film circuit on at least one surface of the substrate, one or more monolithic chips mounted on the substrate and wire-bonded to the film circuit, an array of terminal pins disposed along at least one edge of the substrate and affixed to the substrate by respective pin clips, and wire bonds interconnecting the terminal pins to the circuit;
   a shell of generally rectangular configuration having a top wall and four side walls defining an interior space accommodating the hybrid circuit and including:
   first means integral with the shell engaging and supporting the substrate a predetermined distance from the inner surface of the top wall;
   second means integral with the shell accommodating the terminal pins and associated pin clips; and
   third means integral with the shell to provide a bonding surface around the perimeter of the substrate; and
   an encapsulate bonded onto at least the perimeter of the outer surface of the substrate and bonded onto the third means and around the portions of the terminal pins at the second integral means and operative to seal the package and rigidly retain the terminal pins extending therethrough.

2. A hybrid circuit package comprising a ceramic substrate, a film circuit on at least one surface of the substrate, one or more monolithic chips mounted on the substrate and wire-bonded to the film circuit, an array of terminal pins disposed along at least one edge of the substrate and affixed to the substrate by respective pin clips, and wire bonds interconnecting the terminal pins to the circuit;
   a shell of generally rectangular configuration having a top wall and four side walls defining an interior space accommodating the hybrid circuit and including:
   a first step portion extending along one pair of confronting side walls at a first distance from the inner surface of the top wall engaging and supporting confronting edges of the substrate;
   a second step portion extending along the other pair of confronting side walls at a second distance from the inner surface of the top wall less than the first distance accomodating the terminal pins and associated pin clips; and
   a third step portion extending along the four side walls at a third distance from the inner surface of the top wall greater than the first distance to provide a surface surrounding the periphery of the substrate; and
   an encapsulate bonded on at least the perimeter of the outer surface of the substrate and bonded onto the third step portion and around the portions of the terminal pins at the second step portion and operative to seal the package and rigidly retain the terminal pins extending therethrough.

3. The hybrid circuit package of claim 2 wherein the encapsulate is bonded over the entire outer surface of the substrate.

4. The hybrid circuit package of claim 2 wherein the shell includes integral corner portions outwardly extending from the peripheral edge of the side walls and operative to maintain spacing between the mounting surface of a circuit board and the confronting surface of the circuit package mounted thereon.

5. The hybrid circuit package of claim 2 wherein the shell is fabricated of a plastic material.

6. The hybrid circuit package of claim 2 wherein the third step portion has a surface substantially coplanar with the outer surface of the substrate.

* * * * *